United States Patent
Choi et al.

(10) Patent No.: US 7,442,336 B2
(45) Date of Patent: Oct. 28, 2008

(54) CAPILLARY IMPRINTING TECHNIQUE

(75) Inventors: Byung-Jin Choi, Round Rock, TX (US); Sidlgata V. Sreenivasan, Austin, TX (US); Michael P. C. Watts, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 10/645,306

(22) Filed: Aug. 21, 2003

(65) Prior Publication Data

US 2005/0061773 A1    Mar. 24, 2005

(51) Int. Cl.
*B29C 35/08* (2006.01)
*B29C 41/12* (2006.01)
*B81C 1/00* (2006.01)

(52) U.S. Cl. ...................... 264/496; 264/319
(58) Field of Classification Search ............... 264/293, 264/299, 494, 496, 319
See application file for complete search history.

(56) References Cited

U.S. PATENT DOCUMENTS

| | | | |
|---|---|---|---|
| 4,267,212 A | 5/1981 | Sakawaki | |
| 4,512,848 A | 4/1985 | Deckman et al. | |
| 4,731,155 A | 3/1988 | Napoli et al. | |
| 4,908,216 A * | 3/1990 | Dullings et al. | 425/3 |
| 4,959,252 A | 9/1990 | Bonnebat et al. | |
| 5,028,366 A | 7/1991 | Harakal et al. | |
| 5,110,514 A | 5/1992 | Soane | |
| 5,132,069 A | 7/1992 | Newton | |
| 5,206,983 A | 5/1993 | Guckel et al. | |
| 5,240,550 A | 8/1993 | Boehnke et al. | |
| 5,259,926 A | 11/1993 | Kuwabara et al. | |
| 5,425,848 A | 6/1995 | Haisma et al. | |
| 5,480,047 A | 1/1996 | Tanigawa et al. | |
| 5,512,131 A | 4/1996 | Kumar et al. | |
| 5,545,367 A | 8/1996 | Bae et al. | |
| 5,601,641 A | 2/1997 | Stephens | |
| 5,669,303 A | 9/1997 | Maracas et al. | |

(Continued)

FOREIGN PATENT DOCUMENTS

DE    2800476 A1    7/1978

(Continued)

OTHER PUBLICATIONS

Colburn et al., Step and Flash Imprint Lithography for sub-100 nm Patterning, Proceedings of SPIE vol. 3997, pp. 453-457, Jan. 1, 2000.

(Continued)

*Primary Examiner*—Leo B Tentoni
(74) *Attorney, Agent, or Firm*—Fish & Richardson P.C.

(57) ABSTRACT

The present invention provides a method for patterning a substrate with a template having a mold that features positioning conformable material between the substrate and the mold and filling a volume defined between the mold and the substrate with the conformable material through capillary action between the conformable material and one of the mold and the substrate. Thereafter, the conformable material is solidified. Specifically, the distance between the mold and the substrate is controlled to a sufficient degree to attenuate, if not avoid, compressive forces between the mold and the substrate. As a result, upon initial contact of the mold with the conformable material, spontaneous capillary filling of the volume between the mold and the substrate occurs.

62 Claims, 6 Drawing Sheets

U.S. PATENT DOCUMENTS

| | | |
|---|---|---|
| 5,723,176 A | 3/1998 | Keyworth et al. |
| 5,753,014 A | 5/1998 | Van Rijn |
| 5,772,905 A | 6/1998 | Chou |
| 5,776,748 A | 7/1998 | Singhvi et al. |
| 5,820,769 A | 10/1998 | Chou |
| 5,849,209 A | 12/1998 | Kindt-Larsen et al. |
| 5,849,222 A | 12/1998 | Jen et al. |
| 5,888,650 A | 3/1999 | Calhoun et al. |
| 5,900,160 A | 5/1999 | Whitesides et al. |
| 5,912,049 A | 6/1999 | Shirley |
| 5,948,470 A | 9/1999 | Harrison et al. |
| 5,952,127 A | 9/1999 | Yamanaka |
| 5,956,216 A | 9/1999 | Chou |
| 6,039,897 A | 3/2000 | Lochhead et al. |
| 6,046,056 A | 4/2000 | Parce et al. |
| 6,074,827 A | 6/2000 | Nelson et al. |
| 6,128,085 A | 10/2000 | Buermann et al. |
| 6,168,845 B1 | 1/2001 | Fontana, Jr. et al. |
| 6,180,239 B1 | 1/2001 | Whitesides et al. |
| 6,218,316 B1 | 4/2001 | Marsh |
| 6,234,379 B1 | 5/2001 | Donges |
| 6,274,294 B1 | 8/2001 | Hines |
| 6,309,580 B1 | 10/2001 | Chou |
| 6,316,290 B1 | 11/2001 | Wensel |
| 6,326,627 B1 | 12/2001 | Putvinski et al. |
| 6,334,960 B1 | 1/2002 | Willson et al. |
| 6,348,999 B1 | 2/2002 | Summersgill et al. |
| 6,355,198 B1 | 3/2002 | Kim et al. |
| 6,391,217 B2 | 5/2002 | Schaffer et al. |
| 6,482,742 B1 | 11/2002 | Chou |
| 6,517,977 B2 | 2/2003 | Resnick et al. |
| 6,517,995 B1 | 2/2003 | Jacobson et al. |
| 6,518,168 B1 | 2/2003 | Clem et al. |
| 6,518,189 B1 | 2/2003 | Chou |
| 6,580,172 B2 | 6/2003 | Mancini et al. |
| 6,646,662 B1 | 11/2003 | Nebashi et al. |
| 6,696,220 B2 | 2/2004 | Bailey et al. |
| 6,713,238 B1 | 3/2004 | Chou et al. |
| 6,753,131 B1 | 6/2004 | Rogers et al. |
| 6,776,094 B1 | 8/2004 | Whitesides et al. |
| 6,809,356 B2 | 10/2004 | Chou |
| 6,828,244 B2 | 12/2004 | Chou |
| 6,849,558 B2 | 2/2005 | Schaper |
| 6,900,881 B2 | 5/2005 | Sreenivasan et al. |
| 6,908,861 B2 | 6/2005 | Sreenivasan et al. |
| 6,916,584 B2 | 7/2005 | Sreenivasan et al. |
| 7,077,992 B2 | 7/2006 | Sreenivasan et al. |
| 2002/0042027 A1 | 4/2002 | Chou et al. |
| 2002/0066978 A1 | 6/2002 | Kim et al. |
| 2002/0094496 A1 | 7/2002 | Choi et al. |
| 2002/0132482 A1 | 9/2002 | Chou |
| 2002/0167117 A1 | 11/2002 | Chou |
| 2002/0177319 A1 | 11/2002 | Chou |
| 2003/0034329 A1 | 2/2003 | Chou |
| 2003/0062334 A1* | 4/2003 | Lee et al. ................ 216/37 |
| 2003/0080471 A1 | 5/2003 | Chou |
| 2003/0080472 A1 | 5/2003 | Chou |
| 2004/0007799 A1 | 1/2004 | Choi et al. |
| 2004/0008334 A1 | 1/2004 | Sreenivasan et al. |
| 2004/0009673 A1 | 1/2004 | Sreenivasan et al. |
| 2004/0021254 A1 | 2/2004 | Sreenivasan et al. |
| 2004/0021866 A1 | 2/2004 | Watts et al. |
| 2004/0022888 A1 | 2/2004 | Sreenivasan et al. |
| 2004/0036201 A1 | 2/2004 | Chou et al. |
| 2004/0046288 A1 | 3/2004 | Chou |
| 2004/0110856 A1 | 6/2004 | Young et al. |
| 2004/0118809 A1 | 6/2004 | Chou et al. |
| 2004/0124566 A1 | 7/2004 | Sreenivasan et al. |
| 2004/0131718 A1 | 7/2004 | Chou et al. |
| 2004/0137734 A1 | 7/2004 | Chou et al. |
| 2004/0156108 A1 | 8/2004 | Chou et al. |
| 2004/0170771 A1 | 9/2004 | Bailey et al. |
| 2004/0192041 A1 | 9/2004 | Jeong et al. |
| 2004/0197843 A1 | 10/2004 | Chou et al. |
| 2004/0250945 A1 | 12/2004 | Zheng et al. |
| 2005/0037143 A1 | 2/2005 | Chou et al. |
| 2006/0062867 A1 | 3/2006 | Choi et al. |
| 2006/0076717 A1 | 4/2006 | Sreenivasan et al. |
| 2006/0077374 A1 | 4/2006 | Sreenivasan et al. |

FOREIGN PATENT DOCUMENTS

| | | |
|---|---|---|
| GB | 2177342 | 1/1987 |
| JP | 1-196749 A | 8/1989 |
| JP | 02-24848 A | 1/1990 |
| JP | 02-92603 A | 4/1990 |
| JP | 02192045 | 7/1990 |
| WO | WO 87/02935 | 5/1987 |
| WO | WO 99/05724 A1 | 2/1999 |
| WO | WO 00/21689 A1 | 4/2000 |
| WO | WO 01/47003 A2 | 6/2001 |
| WO | WO 01/53889 A1 | 7/2001 |
| WO | WO 01/63361 A1 | 8/2001 |
| WO | WO 01/90816 A1 | 11/2001 |
| WO | WO 02/07199 A1 | 1/2002 |
| WO | WO 03/010289 A2 | 2/2003 |
| WO | WO 03/079416 A1 | 9/2003 |
| WO | WO 03/099536 A1 | 12/2003 |
| WO | WO 2004/114016 A2 | 12/2004 |

OTHER PUBLICATIONS

Johnson et al., Advances in Step and Flash Imprint Lithography, SPIE Microlithography Conference, Feb. 23, 2003.

Heidari, Nanoimprint Lithography at the 6 in. Wafer Scale, J. Vac. Sci. Technol. B 18(6), pp. 3557-3560, Nov. 1, 2000.

Translation of Japanese Patent 02-92603, (Apr. 3, 1990).

Translation of Japanese Patent 02-24848, (Jan. 26, 1990).

Chou et al., Ultrafast and Direct Imprint of Nanostructures in Silicon, Nature, col. 417, (Jun. 2002), pp. 835-837, Jun. 1, 2002.

Chou et al., Nanoimprint Lithography, Journal of Vacuum Science Technolgoy B 14(16), pp. 4129-4133, Nov. 1, 1996.

Colburn et al., Development and Advantages of Step-and-Flash Lithography, Solid State Technology, Jul. 1, 2001.

Colburn et al., Characterization and Modeling of Volumetric and Mechanical Properties for Step and Flash Imprint Lithography Photopolymers, Journal of Vacuum Science Technology. vol. b. 19(6), Nov. 1, 2001.

Bailey et al., Step and Flash Imprint Lithography: Defect Analysis, Journal of Vacuum Science, B 19(6), pp. 2806-2810, Nov. 1, 2001.

Bailey et al., Step and Flash Imprint Lithography: Template Surface Treatment and Defect Analysis, Journal of Vacuum Science, B 18(6), pp. 3572-3577, Nov. 1, 2000.

Schneider et al., Stripes of Partially Fluorinated Alkyl Chains: Dipolar Langmuir Monolayers, (undated).

Shibuichi et al., Super Water- and Oil-Repellent Surfaces Resulting from Fractal Structure, Journal of Colloid and Interface Science, vol. 208, No. 1, pp. 287-294 Dec. 1, 1998.

U.S. Appl. No. 11/126,946, naming Inventors Choi et al., entitled Formation of Discontinuous Films During an Imprint Lithography Process, filed May 11, 2005.

U.S. Appl. No. 11/127,041. naming Inventors Sreenivasan et al., entitled Step and Repeat Imprint Lithography Processes, filed May 11, 2005.

U.S. Appl. No. 11/127,060, naming Inventors Sreenivasan et al., entitled Step and Repeat Imprint Lithography Systems, filed May 11, 2005.

Cowie, "Polymers: Chemistry and Physics of Modern Materials," 1991, pp. 408-409, 2$^{nd}$ Ed, Chapman and Hall, a division of Routledge, Chapman and Hall, Inc., 29 West 35$^{th}$ Street, NY, NY 10001-2291.

Krug et al., "Fine Patterning of Thin Sol-Gel Films," Journal of Non-Crystalline Solids, 1992, pp. 447-450, vol. 147 & 148.

Kotachi et al., "Si-Containing Positive Resist for ArF Laser Lithography," J. PhotopolymerSci. Tevhnol. 8(4) 615-622. 1995.

Krauss et al., "Fabrication of Nanodevices Using Sub-25nm Imprint Lithography." Appl. Phys. Lett 67(21), 3114-3116, 1995.

Chou et al., "Imprint of Sub-25 nm Vias and Trenches in Polymers," Applied Physics Letters, Nov. 20, 1995, pp. 3114-3116, vol. 67(21).

Chou et al., "Imprint Lithography with 25-Nanometer Resolution," Science, Apr. 5, 1996, pp. 85-87, vol. 272.

Haisma et al., "Mold-Assisted Nanolithography: A Process for Reliable Pattern Replication," Journal of Vacuum Science and Technology, Nov./Dec. 1996, pp. 4124-4128, vol. B 14(6).

Chou et al., "Imprint Lithography with Sub-10nm Feature Size and High Throughput," Microelectronic Engineering, 1997, pp. 237-240, vol. 35.

Scheer et al., "Problems of the Nanoimprinting Technique for Nanometer Scale Pattern Definition," Journal of Vacuum Science and Technology, Nov./Dec. 1998, pp. 3917-3921, vol. B 16(6).

Xia et al., "Soft Lithography," Annu. Rev. Mater. Sci., 1998, pp. 153-184, vol. 28.

Xia et al., "Soft Lithography," Agnew. Chem. Int. Ed., 1998, pp. 550-575, vol. 37.

Wu et al., "Large Area High Density Quantized Magnetic Disks Fabricated Using Nanoimprint Lithography," Journal of Vacuum Science and Technology, Nov./Dec. 1998, pp. 3825-3829, vol. B 16(6).

Colburn. et al., "Step and Flash Imprint Lithography: A New Approach to High-Resolution Patterning", Proc. of SPIE, 1999, pp. 379-389, vol. 3676.

Chou et al., "Lithographically-Induced Self Assembly of Periodic Polymer Micropillar Arrays," Journal of Vacuum Science and Technology, Nov./Dec. 1999, pp. 3197-3202, vol. B 17(6).

Ruchhoeft et al., "Patterning Curved Surfaces: Template Generation by Ion Beam Proximity Lithography and Relief Transfer by Step and Flash Imprint Lithography," Journal of Vacuum Science and Technology, 1999, pp. 2965-2982, vol. 17.

Choi et al., "Design of Orientation Stages for Step and Flash Imprint Lithography," Precision Engineering, Journal of the International Societies for Precision Engineering and Nanotechnology, 2001, pp. 192-199, vol. 25.

Chou, "Nanoimprint Lithography and Lithographically Induced Self-Assembly," MRS Bulletin, Jul. 2001, pp. 512-517.

Mirkin et al., "Emerging Methods for Micro-and Nanofabrication," MRS Bulletin, Jul. 2001, pp. 506-509.

Choi et al., "High Precision Orientation Alignment and Gap Control Stages for Imprint Lithography Processes," U.S. Appl. No. 09/698,317, Filed with USPTO on Oct. 27, 2000.

Bender M. et al., "Fabrication of Nanostructures using a UV-based Imprint Technique," Microelectronic Engineering, pp. 223-236, 2000.

Sreenivasan et al., "High-Resolution Overlay Alignment Methods and Systems for Imprint Lithography," U.S. Appl. No. 09/907,512, Filed with USPTO on Jul. 16, 2001.

Choi et al., "Method and System of Automatic Fluid Dispensing for Imprint Lithography Processes," U.S. Appl. No. 09/908,455, Filed with USPTO on Jul. 17, 2001.

Choi et al., "Methods for High-Precision Gap and Orientation Sensing Between a Transparent Template and Substrate for Imprint Lithography," U.S. Appl. No. 09/920,341, Filed with USPTO on Aug. 1, 2001.

Nguyen, A. Q., "Asymmetric Fluid-Structure Dynamics in Nanoscale Imprint LIthography," University of Texas at Austin, Aug. 2001.

Bailey et al., "Template for Room Temperature Low Pressure Micro- and Nano-Imprint Lithography," U.S. Appl. No. 09/976,681, Filed with USPTO on Oct. 12, 2001.

Watts et al., "Low Viscosity High Resolution Patterning Material," U.S. Appl. No. 10/178,947, Filed with USPTO on Jun. 24, 2002.

Watts et al., "System and Method for Dispensing Liquids," U.S. Appl. No. 10/191,749, Filed with USPTO Jul. 9, 2002.

Sreenivasan et al., "Method and System for Imprint Lithography Using an Electric Field," U.S. Appl. No. 10/194,410, Filed with USPTO Jul. 11, 2002.

Sreenivasan et al., "Step and Repeat Imprint Lithography Systems," U.S. Appl. No. 10/194,414, Filed with USPTO Jul. 11, 2002.

Fletcher et al., "Imprint Lithography Method to Control Extrusion of a Liquid from a Desired," U.S. Appl. No. 11/051,533, Filed with the USPTO on Feb. 4, 2005.

Feynman, There's Plenty of Room at the Bottom, Caltech Engineering and Science, Feb. 1960, California USA.

Abstract of Japanese Patent 02-24848, Jan. 26, 1990.

Colburn et al., Dissertation for the Degree of Doctor of Philosophy, Step and Flash Imprint Lithography: A Low-Pressure, Room-Temperature Nanoimprint Lithography Aug. 1, 2001.

Choi et al., U.S. Appl. No. 11/774,710 entitled Method of Automatic Fluid Dispensing for Imprint Lithography Processes, filed Jul. 9, 2007.

Michel et al., Printing meets lithography: soft approaches to high-resolution patterning, IBM J. Res. & Dev. vol. 45 No. 5, Sep. 2001.

* cited by examiner

FIG. 12

CAPILLARY IMPRINTING TECHNIQUE

BACKGROUND OF THE INVENTION

The field of invention relates generally to micro-fabrication of structures. More particularly, the present invention is directed to patterning substrates in furtherance of the formation of structures.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing a reduction in the minimum feature dimension of the structures formed. Other areas of development in which micro-fabrication has been employed include biotechnology, optical technology, mechanical systems and the like.

An exemplary micro-fabrication technique is shown in U.S. Pat. No. 6,334,960 to Willson et al. Willson et al. disclose a method of forming a relief image in a structure. The method includes having a mold make mechanical contact with the polymerizable fluid disposed on a substrate. The mold includes a relief structure. Under the compressive force created between the mold and substrate, the polymerizable fluid fills the relief structure in the mold. Thereafter, the polymerizable fluid is subjected to conditions to solidify and polymerize the same, forming a solidified polymeric material on the transfer layer that contains a relief structure complimentary to that of the mold. The mold is then separated from the solid polymeric material such that a replica of the relief structure in the mold is formed in the solidified polymeric material. The post processing steps are undertaken to transfer the relief image into the substrate.

To accurately form the pattern in the polymeric material, sufficient time and force is employed to ensure that the relief structure is completely filled while controlling the distribution of the polymerizable fluid over the substrate. For example, to decrease the time required to imprint a polymerizable fluid with a given viscosity, involves increasing the compressive force between the mold and the substrate. However, too great a compressive force results in the polymerizable fluid spreading to undesired regions of the substrate. Conversely, to obtain precise control over the distribution of the polyermizable fluid over the substrate, often involves decreasing the compressive force between the mold and the substrate. As a result, the time required to imprint the polymerizable material increases. Thus, a tradeoff exists between compressive force employed and time required to imprint the polymerizable fluid.

A need exists, therefore, to reduce the time required to pattern polymerizable fluid while maintaining adequate control of the distribution of the polymerizable fluid over the surface of the substrate.

SUMMARY OF THE INVENTION

The present invention provides a method for patterning a substrate with a template having a mold that features positioning conformable material between the substrate and the mold and filling a volume defined between the mold and the substrate with the conformable material through capillary action between the conformable material and one of the mold and the substrate. Thereafter, the conformable material is solidified. Specifically, the movement between the mold and the substrate is controlled to a sufficient degree to attenuate, if not avoid, compressive forces between the mold and the substrate. As a result, upon initial contact of the mold with the conformable material, spontaneous capillary filling of the volume between the mold and the substrate occurs. The capillary filling creates pulling forces between the mold and the substrate, which is referred to as a negative imprint force. Many benefits result from the negative imprint force, including rapid and complete filling of the features of the mold, as well as precise control of the distribution of the conformable material of the substrate. These and other embodiments are described more fully below.

DETAILED DESCRIPTION OF THE INVENTION

Figure 1:
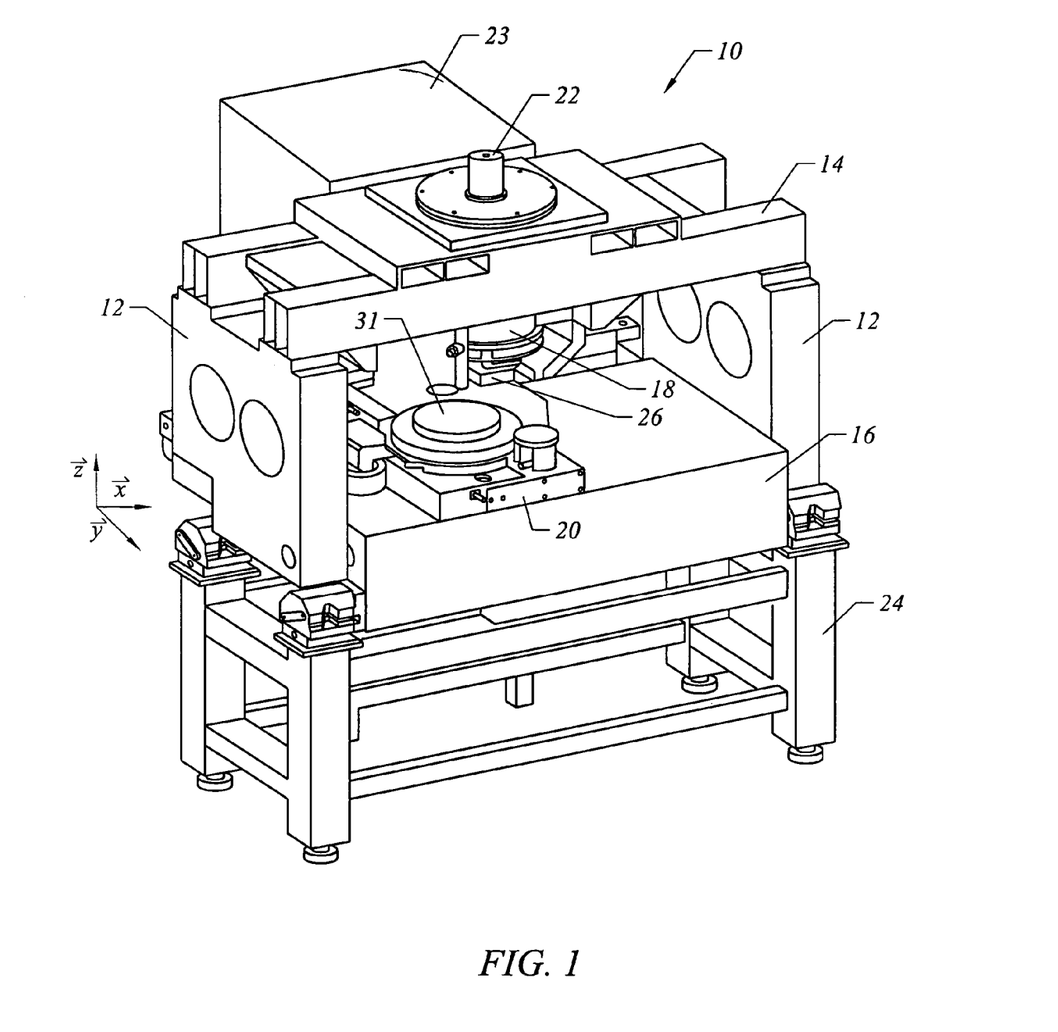
FIG. 1 is a perspective view of a patterning system in accordance with the present invention.

FIG. 1 depicts a lithographic system 10 in accordance with one embodiment of the present invention that includes a pair of spaced-apart bridge supports 12 having a bridge 14 and a stage support 16 extending therebetween. Bridge 14 and stage support 16 are spaced-apart. Coupled to bridge 14 is an imprint head 18, which extends from bridge 14 toward stage support 16. Disposed upon stage support 16 to face imprint head 18 is a motion stage 20. Motion stage 20 is configured to move with respect to stage support 16 along X and Y axes, and may optionally facilitate movement along a Z axis, as well. A radiation source 22 is coupled to lithographic system 10 to impinge actinic radiation upon motion stage 20. As shown, radiation source 22 is coupled to bridge 14 and includes a power generator 23 connected to radiation source 22.

Figure 2:
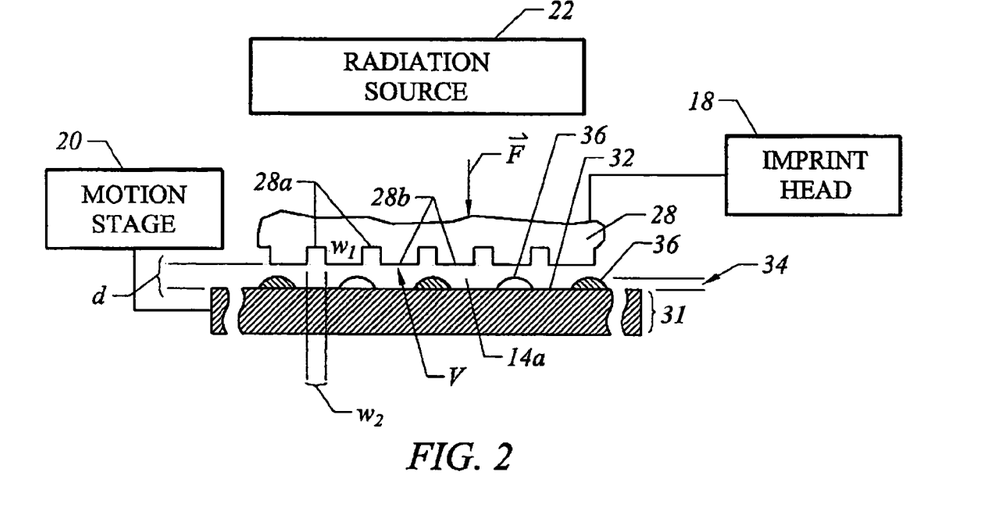
FIG. 2 is a simplified elevation view of a patterning system shown in FIG. 1.

Referring to both FIGS. 1 and 2, connected to imprint head 18 is a template 26 having a mold 28 thereon. Mold 28 includes a plurality of features defined by a plurality of spaced-apart recessions 28a and protrusions 28b. The plurality of features defines an original pattern that is to be transferred into a substrate 31 positioned on motion stage 20. Substrate 31 may comprise of a bare wafer or a wafer with one or more layers disposed thereon. To that end, imprint head 18 is adapted to move along the Z axis and vary a distance "d" between mold 28 and substrate 31. In this manner, the features on mold 28 may be imprinted into a conformable region of substrate 31, discussed more fully below. Radiation source 22 is located so that mold 28 is positioned between radiation source 22 and substrate 31. As a result, mold 28 is fabricated from material that allows it to be substantially transparent to the radiation produced by radiation source 22.

Figure 3:
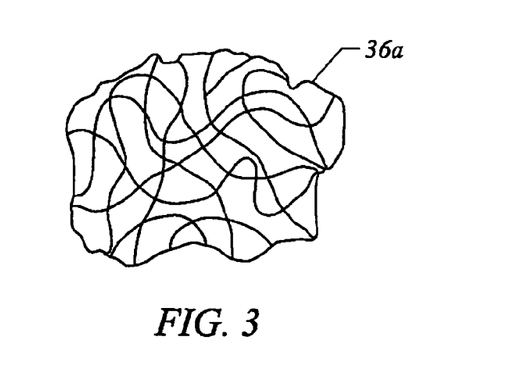
FIG. 3 is a simplified representation of material from which an imprinting layer, shown in FIG. 2, is comprised before being polymerized and cross-linked.

Referring to both FIGS. 2 and 3, a conformable region, such as an imprinting layer 34, is disposed on a portion of surface 32 that presents a substantially planar profile. It should be understood that the conformable region may be formed using any known technique to produce conformable material, such as a hot embossing process disclosed in U.S. Pat. No. 5,772,905 to Chou, which is incorporated by reference in its entirety herein, or a laser assisted direct imprinting (LADI) process of the type described by Chou et al. in *Ultrafast and Direct Imprint of Nanostructures in Silicon*, Nature, Col. 417, pp. 835-837, June 2002. In the present embodiment, however, conformable region consists of imprinting layer 34 being deposited as a plurality of spaced-apart discrete droplets 36 of imprinting material 36a on substrate 31, discussed more fully below. Imprinting layer 34 is formed from imprinting material 36a that may be selectively polymerized and cross-linked to record a pattern that is complementary to the original pattern, defining a recorded pattern. Imprinting material 36a is shown in FIG. 4 as being cross-linked at points 36b, forming cross-linked polymer material 36c.

Figure 4:
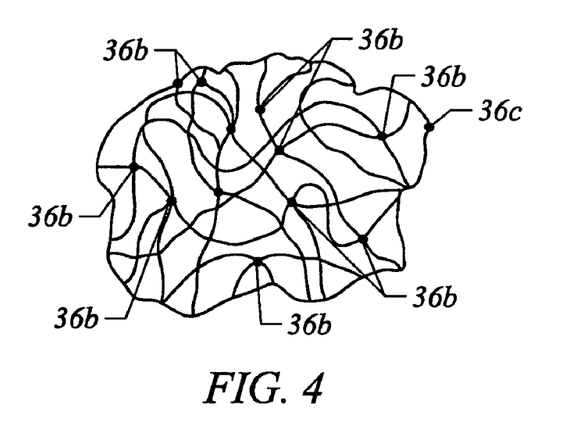
FIG. 4 is a simplified representation of cross-linked polymer material into which the material shown in FIG. 3 is transformed after being subjected to radiation.

Referring to FIGS. 2, 3 and 4, after a desired distance "d" has been reached, radiation source 22 produces actinic radiation that polymerizes and cross-links imprinting material 36a, forming polymer material 36c in which a substantial portion thereof is cross-linked. As a result, imprinting material 36a transforms to polymer material 36c, which is a solid, forming imprinting layer 134, shown in FIG. 5. Specifically, polymer material 36c is solidified to provide side 34c of imprinting layer 134 with a shape conforming to a shape of a surface 28c of mold 28, with imprinting layer 134 having recesses 30. After imprinting layer 134 is transformed to consist of polymer material 36c, shown in FIG. 4, imprint head 18, shown in FIG. 2, is moved to increase distance "d" so that mold 28 and imprinting layer 134 are spaced-apart.

Figure 5:
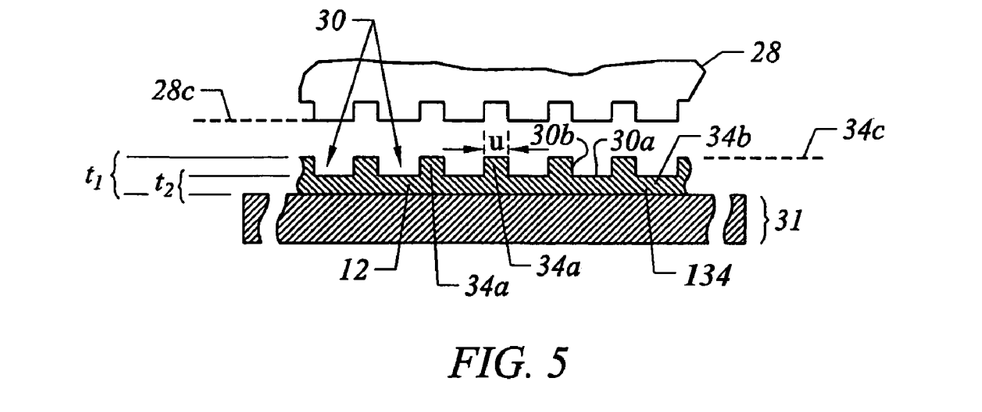
FIG. 5 is a simplified elevation view of a mold spaced-apart from the imprinting layer, shown in FIG. 2, after patterning of the imprinting layer.

Referring to FIGS. 2, 3 and 5, the pattern recorded in imprinting layer 34 may be produced primarily, if not solely, by capillary force of imprinting material 36a with mold 28 and/or substrate 31. The amount of external force, i.e., non-capillary pressure, employed is dependent upon several factors, including the composition of imprinting material 36a, the resulting thickness of imprinting layer 34 and the area over which imprinting material 36a must spread. For example, a fixed composition of imprinting material 36a and a fixed area over which imprinting material 36a is to spread, there is a minimum distance d' between substrate 31 and protrusions 28b that is reached before capillary filling occurs. Were thickness $t_2$ of imprinting layer 34 greater than d' very little capillary pressure would be employed to spread imprinting material 36a, i.e., a greater amount of compressive forces would be exerted on mold 28. In that case, an external positive force F is employed to spread imprinting material 36a in droplets 36 in a desirable amount of time. In this manner, imprinting material 36a in droplets 36 is spread primarily with external pressure applied thereto via mold 28 a sufficient amount until imprinting material 36a is spread between mold 28 and substrate 31, as desired.

Assuming, for the fixed area and fixed composition of imprinting material 36a, that $t_2$ is less than or equal to d', the amount of capillary pressure becomes primarily a function of thickness $t_2$ and the fraction of the fixed area to be filled with imprinting material 36a, i.e., the portion of the fixed area upon which imprinting material 36a is absent. More particularly, the amount of capillary pressure generated during imprinting is proportional to the fraction of the fixed area to be filled and inversely proportional to thickness $t_2$. Understanding that thickness $t_2$ is dependent upon distance d, it becomes important to carefully control distance d during the imprinting process. Control of distance d may be frustrated by compliance in imprint head 18 and/or motion stage 20. In this situation, rapid capillary filling occurs upon contact of droplets 36 with mold 28. Specifically, relative movement between mold 28 and substrate 31 is controlled so that distance d decreases to place surface 28c of mold 28 in contact with droplets 36. Contact with surface 28c of mold 28 distorts the hemispherical shape of droplets 36, causing the same to initiate wetting/spreading across surface 28c of mold 28, as well as over surface 32 of substrate 31. The distance d continues to decrease until a volume V is defined between mold 28 and the region of substrate 31 in superimposition therewith fills with imprinting material 36a through capillary action.

Figure 6:
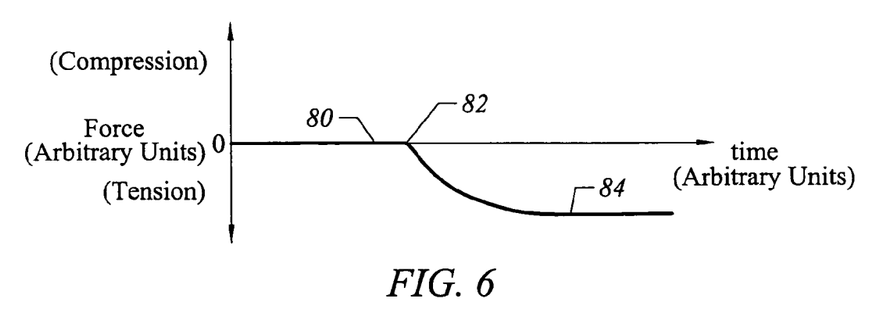
FIG. 6 is a graphical representation of the forces to which a mold, shown in FIG. 2 is subjected during imprinting processes.

Referring to FIGS. 2 and 6, force measurements on mold 28 during an exemplary capillary imprint method is shown with point 80 wherein droplets 36 are initially contact with mold. As shown, the compressive and tensile forces to which mold 28 is subjected are substantially zero. At point 82, capillary filling of volume V is initiated so that mold 28 is subjected to tension force T. A point 84, tension force T has reached a maximum magnitude, i.e., substantially all of imprinting material 36a in volume V is undergoing capillary attraction with mold 28 and substrate 31.

Specifically, relative movement of mold 28 and substrate 31 is effectuated to attenuate, if not avoid, subjecting mold 28 to compressive forces resulting from contact with imprinting material 36a. The compressive forces $C_1$ and $C_2$, shown in FIG. 7, that are sought to be minimized result from imprint head 18 pushing against mold 28 as imprinting material 36a pushes against mold 28 during imprinting. This facilitates spontaneous capillary filling of volume V occurring upon initial contact of mold 28 with imprinting material 36a in droplets 36. The capillary filling creates pulling/tensional forces, T, upon mold 28, referred to as a negative imprint force. The negative imprinting force, or tension force, T causes elongation of imprint head 18 and substrate 31 subjecting mold 28 to tension force T.

Figure 7:
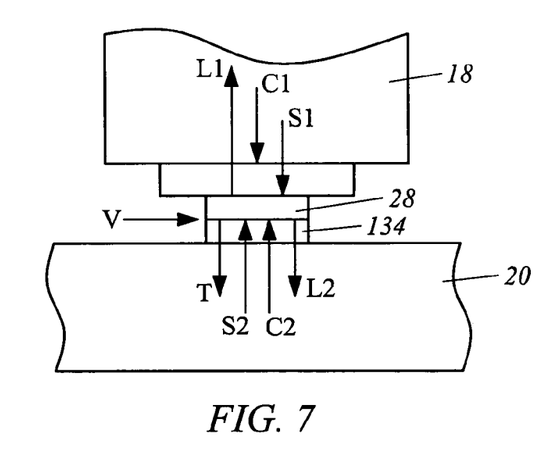
FIG. 7 is a detailed view of the system shown in FIG. 1.

However, too great a negative imprint force may compromise control of imprinting layer 134 thickness uniformity. It is has been found desirable to minimize the amount of negative imprint force present when attempting to achieve maximum thickness uniformity. To that end, movement between mold 28 and substrate 31 is effectuated to maximize thickness uniformity of imprinting layer 134, i.e., to ensure that $t_1$ is uniform over the area of imprinting layer 134 and that $t_2$ is uniform over the area of imprinting layer. This is achieved by minimizing the magnitude and/or time that mold 28 is subjected to compressive forces $C_1$ and $C_2$ and tension force T. To that end, pushing forces $S_1$ and/or $S_2$, as well as pulling forces $L_1$ and/or $L_2$, may be employed to compensate for the presence of compressive forces $C_1$ and $C_2$ and tension force T.

Specifically, imprint head 18 would apply pulling force $L_1$ to attenuate, if not nullify, compressive forces $C_1$ and $C_2$. Alternatively, motion stage 20 would generate pulling force $L_2$ to attenuate, if not nullify, compressive forces $C_1$ and $C_2$ or imprint head 18 and motion stage 20 could move in conjunction with one another to attenuate or nullify forces $C_1$ and $C_2$. In a similar fashion, imprint head 18 could apply pushing force $S_1$ to attenuate, if not nullify, tension force T and/or motion stage 20 would generate pulling force $L_2$ to attenuate, if not nullify, tension force T. In this manner, the magnitude of tensile and/or compressive forces may be controlled as desired in order to maximize imprinting layer 134 thickness uniformity while still obtaining a desired distance d.

Figure 8:
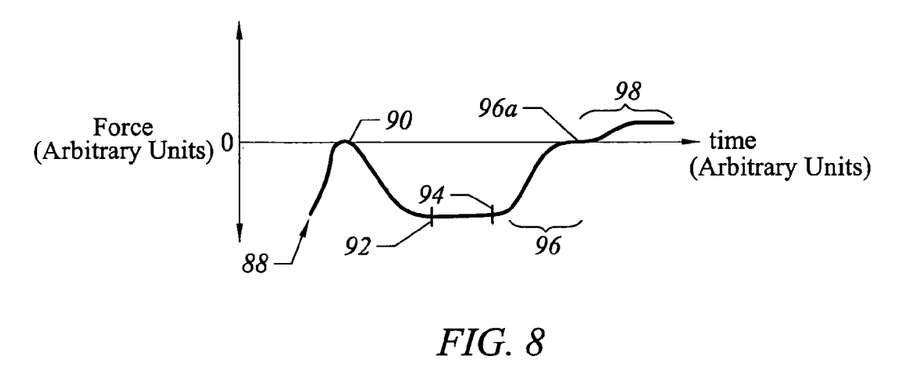
FIG. 8 is a graphical representation of the forces to which a mold, shown in FIG. 2 is subjected during imprinting processes in accordance with an alternate embodiment of the present invention.

Referring to FIGS. 2 and 8, force measurements on mold 28 during an exemplary capillary imprint method employed to maximize thickness uniformity is shown with point 88 wherein droplets 36 are initially contact with mold. As shown, the compressive and tensile forces to which mold 28 is subjected are substantially zero. At point 90, capillary filling of volume V is initiated so that mold 28 is subjected to tension force T. A point 92, tension force T has reached a maximum magnitude. At point 94, substantially all of imprinting material 36*a* in volume V has undergone capillary attraction with mold 28, i.e. volume V is substantially filled with imprinting material 36*a*. In region 96 either pulling force $L_1$ or pulling force $L_2$ or a combination thereof is applied to mold 28, thereby reducing the forces to which the same is subjected to substantially zero at point 96*a*. Were pushing force $S_1$ employed, mold 28 may be subjected to compressive force $C_2$ that is shown as region 98.

Figure 9:
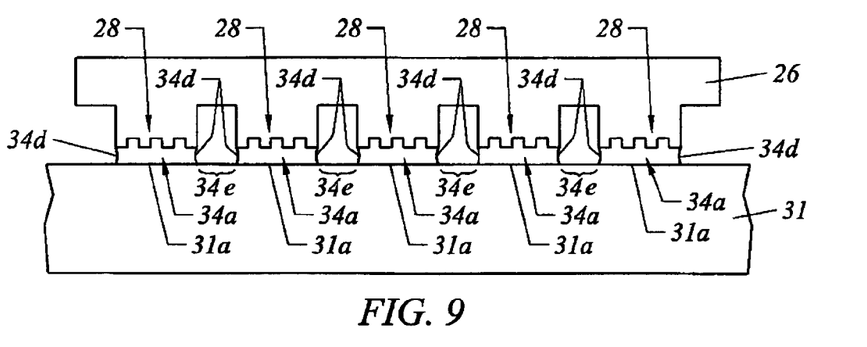
FIG. 9 is a close-up view of the template, shown in FIG. 1, having multiple molds formed thereon, shown in FIG. 2, to concurrently imprint multiple pattern regions on the substrate in accordance with the present invention.

Referring to FIGS. 5 and 9, many benefits result from the negative imprint force, including rapid and complete filling of the features of mold 28, such as recessions 28*a*, as well as precise control of the distribution of the conformable imprinting material 36*a* of the substrate 31. Additionally negative imprint forces facilitate control of the distribution of imprinting material 36*a*, shown in FIG. 3, on substrate 31.

As a result, template 26 may be provided with a plurality of molds 28 so that multiple discrete patterns may be formed on substrate 31, concurrently. Relying on capillary attraction between imprinting material 36*a* and/or mold 28 and substrate 31, imprinting material 36*a* does not extend between adjacent patterned areas 31*a* on substrate 31. Rather, imprinting material 36*a* remains confined within a region of substrate 31 that is in superimposition with one of the molds 28. As seen, imprinting material 36*a* forms a meniscus 34*d* at the periphery of mold 28 due to the surface tension of imprinting material 36*a*. A hiatus 34*e* is present between adjacent patterned areas 31*a*. The surface tension associated with imprinting material 36*a* in meniscus 34*d* substantially reduces the probability that imprinting material 36*a* will extend through hiatus 34*e*.

Figure 10:
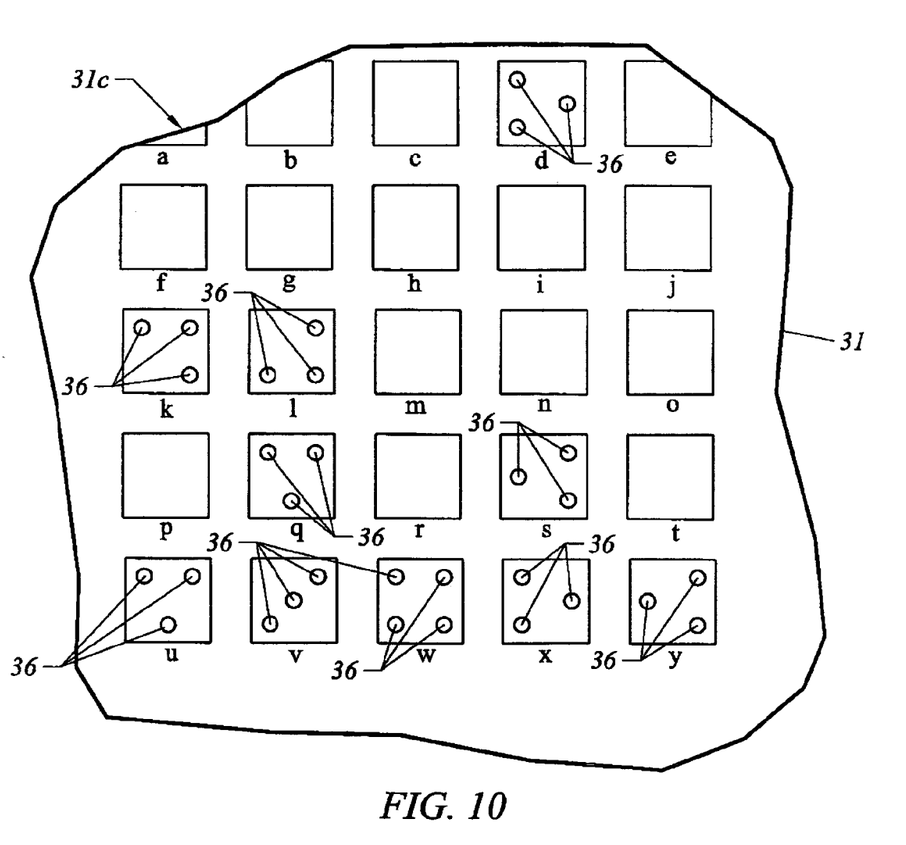
FIG. 10 is a top down plan view of a portion of the substrate, shown in FIG. 1, showing a plurality of regions that are in superimposition with the molds of template, shown in FIG. 9, in accordance with the present invention.
Figure 11:
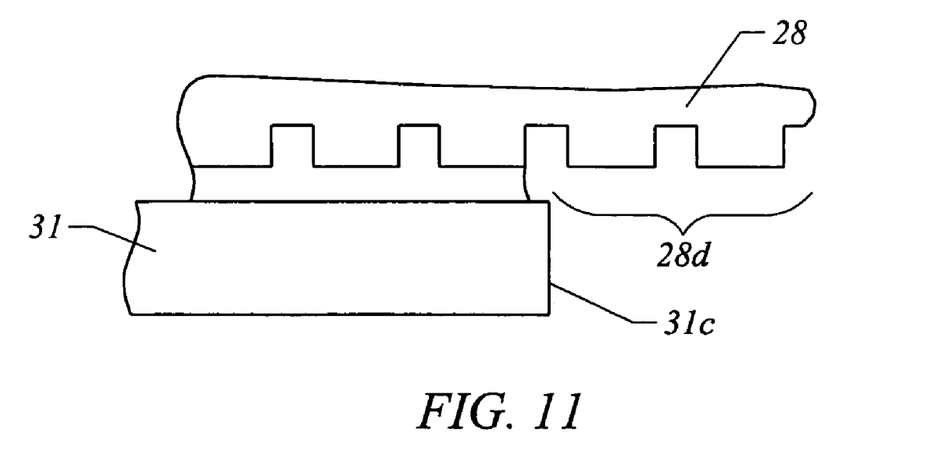
FIG. 11 is a detailed side view showing a portion of the mold, shown in FIG. 2, extending from an edge of the substrate, in accordance with an alternate embodiment of the present invention.

Referring to FIGS. 2, 10 and 11, taking advantage of the surface tension associated with meniscus 34*d*, additional flexibility with the distribution of droplets 36 on substrate 31 is provided. For example, assuming that template 26 includes multiple molds 28 in superimposition with a plurality of regions, shown as a-y on substrate 31. It is not necessary to create patterned areas 31*a* in each of the plurality of regions a-y. Rather, a sub-portion of regions a-y may be provided with droplets 36 of imprinting material 36*a*, shown in FIG. 3, shown as d, k, 1, q, s and u-y. In this manner, after contact with molds 28 on template 26 and subsequent formation of sub-portions 34*a* therein, only a sub-portion of regions a-y would be patterned areas 31*a*. This is beneficial for increasing the useful real estate of substrate 31. As the capillary forces exist between both the surface of mold 28 and the area of the region of substrate 31 in superimposition therewith, patterning may occur at an edge 31*c* of substrate 31. The absence of substrate 31 in a sub-part 28*d* of mold 28 extending beyond substrate 31 prevents imprinting material 36*a* from sub-part 28*d*, shown more clearly in FIG. 11.

To facilitate filling of volume V, which includes recessions 28*a*, imprinting material 36*a* is provided with the requisite properties to completely fill recessions 28*a* while covering surface 32 with a contiguous formation of imprinting material 36*a*. In the present embodiment, sub-portions 34*b*, shown in FIG. 5, of imprinting layer 34 in superimposition with protrusions 28*b* remain after the desired distance, "d", has been reached, leaving sub-portions 34*a* with thickness $t_1$, and sub-portions 34*b* with thickness, $t_2$. Thicknesses "$t_1$" and "$t_2$" may be any thickness desired, dependent upon the application. Typically, $t_1$ is selected so as to be no greater than twice the width u of sub-portions 34*a*, i.e. $t_1 \leq 2u$, shown more clearly in FIG. 5.

Referring to FIG. 5, additional processing may be employed to complete the patterning of substrate 31. For example, substrate 31 and imprinting layer 134 may be etched to transfer the pattern of imprinting layer 134 into substrate 31, providing a patterned surface (not shown). To facilitate etching, the material from which imprinting layer 134 is formed may be varied to define a relative etch rate with respect to substrate 31, as desired.

To that end, imprinting layer 134 may be provided with an etch differential with respect to photo-resist material (not shown) selectively disposed thereon. The photo-resist material (not shown) may be provided to further pattern imprinting layer 134, using known techniques. Any etch process may be employed, dependent upon the etch rate desired and the underlying constituents that form substrate 31 and imprinting layer 134. Exemplary etch processes may include plasma etching, reactive ion etching, chemical wet etching and the like.

Referring to both FIGS. 1 and 2, an exemplary radiation source 22 may produce ultraviolet radiation; however, any known radiation source may be employed. The selection of radiation employed to initiate the polymerization of the material in imprinting layer 34 is known to one skilled in the art and typically depends on the specific application which is desired. Furthermore, the plurality of features on mold 28 are shown as recessions 28*a* extending along a direction parallel to protrusions 28*b* that provide a cross-section of mold 28 with a shape of a battlement. However, recessions 28*a* and protrusions 28*b* may correspond to virtually any feature required to create an integrated circuit and may be as small as a few tens of nanometers.

Referring to FIGS. 1, 2 and 5, the pattern produced by the present patterning-technique may be transferred into substrate 31 to provide features having aspect ratios as great as 30:1. To that end, one embodiment of mold 28 has recessions 28*a* defining an aspect ratio in a range of 1:1 to 10:1. Specifically, protrusions 28*b* have a width $W_1$ in a range of about 10 nm to about 5000 μm, and recessions 28*a* have a width $W_2$ in a range of 10 nm to about 5000 μm. As a result, mold 28 and/or template 26, may be formed from various conventional materials, such as, but not limited to, fused-silica, quartz, silicon, organic polymers, siloxane polymers, borosilicate glass, fluorocarbon polymers, metal, hardened sapphire and the like.

Referring to FIGS. 1, 2 and 3, the characteristics of imprinting material 36*a* are important to efficiently pattern substrate 31 in light of the unique deposition process employed. As mentioned above, imprinting material 36a is deposited on substrate 31 as a plurality of discrete and spaced-apart droplets 36. The combined volume of droplets 36 is such that imprinting material 36a is distributed appropriately over an area of surface 32 where imprinting layer 34 is to be formed. As a result, imprinting layer 34 is spread and patterned concurrently, with the pattern being subsequently set into imprinting layer 34 by exposure to radiation, such as ultraviolet radiation. As a result of the deposition process, it is desired that imprinting material 36a have certain characteristics to facilitate rapid and even spreading of imprinting material 36a in droplets 36 over surface 32 so that all thicknesses $t_1$ are substantially uniform and all thicknesses $t_2$ are substantially uniform. The desirable characteristics include having a low viscosity, e.g., in a range of 0.5 to 5 centepoise (csp), as well as the ability to wet surface of substrate 31 and/or mold 28 and to avoid subsequent pit or hole formation after polymerization. With these characteristics satisfied, imprinting layer 34 may be made sufficiently thin while avoiding formation of pits or holes in the thinner regions, such as sub-portions 34b, shown in FIG. 5.

The constituent components that form imprinting material 36a to provide the aforementioned characteristics may differ. This results from substrate 31 being formed from a number of different materials. As a result, the chemical composition of surface 32 varies dependent upon the material from which substrate 31 is formed. For example, substrate 31 may be formed from silicon, plastics, gallium arsenide, mercury telluride, and composites thereof. Additionally, substrate 31 may include one or more layers in sub-portion 34b, e.g., dielectric layer, metal layer, semiconductor layer, planarization layer and the like.

Referring to FIGS. 1, 2 and 3, an exemplary composition for imprinting material 36a is as follows:

Composition isobornyl acrylate n-hexyl acrylate ethylene glycol diacrylate 2-hydroxy-2-methyl-1-phenyl-propan-1-one In an exemplary composition, isobornyl acrylate comprises approximately 55% of the composition, n-hexyl acrylate comprises approximately 27%, ethylene glycol diacrylate comprises approximately 15% and the initiator 2-hydroxy-2-methyl-1-phenyl-propan-1-one comprises approximately 3%. The initiator is sold under the trade name DAROCUR® 1173 by CIBA® of Tarrytown, N.Y. The above-identified composition also includes stabilizers that are well known in the chemical art to increase the operational life of the composition. To provide suitable release properties, COMPOSITION is typically employed with a template treated to have a mold surface that is hydrophobic and/or low surface energy, i.e. an a priori release layer.

Figure 12:
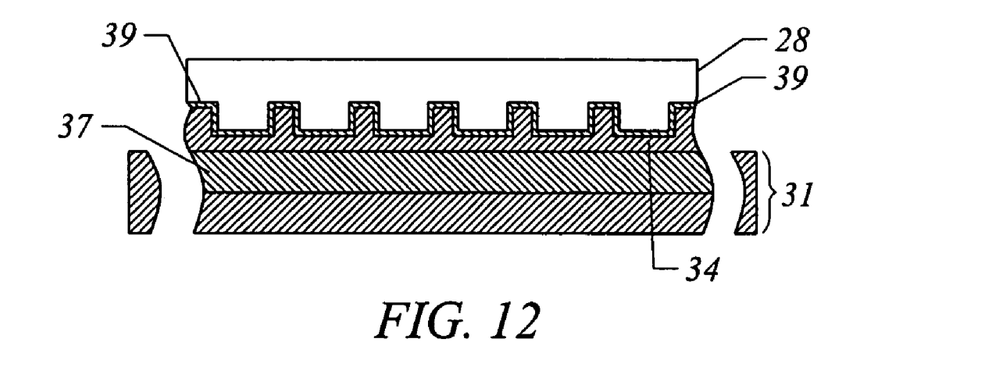
FIG. 12 is a simplified elevation view of material in an imprint device and substrate employed with the present invention in accordance with an alternate embodiment.

Referring to FIGS. 2 and 9, the above-described imprinting technique may be implemented on substrate 31 that includes a planarization layer 37, shown in FIG. 12. The primary function of planarization layer 37 is to ensure that the surface of substrate 31 is smooth, if not, planar. To that end, planarization layer 37 may be formed from a number of differing materials, such as, for example, thermoset polymers, thermoplastic polymers, polyepoxies, polyamides, polyurethanes, polycarbonates, polyesters, and combinations thereof. Planarization layer 37 is fabricated in such a manner so as to possess a continuous, smooth, relatively defect-free surface that may exhibit excellent adhesion to imprinting layer 34.

Additionally, to ensure that imprinting layer 34 does not adhere to mold 28, the surface of mold 28 may be treated with a modifying agent. As a result, imprinting layer 34 is located between planarization layer 37 and the modifying agent. One such modifying agent is a release layer 39, shown in FIG. 12. Release layer 39 and other surface modifying agents, may be applied using any known process. For example, processing techniques may include chemical vapor deposition, physical vapor deposition, atomic layer deposition or various other techniques, brazing and the like. Exemplary release layers are found in U.S. application Ser. No. 10/375,817, entitled Method to Reduce Adhesion Between a Polymerizable Layer and a Substrate Employing a Fluorine-Containing Layer, as well as U.S. application Ser. No. 10/375,832, entitled Composition and Method to Form a Release Layer, both of which are assigned to assignee of the present invention and are incorporated by reference herein.

The embodiments of the present invention described above are exemplary. Many changes and modifications may be made to the disclosure recited above, while remaining within the scope of the invention. The scope of the invention should, therefore, be determined not with reference to the above description, but instead should be determined with reference to the appended claims along with their full scope of equivalents.

What is claimed is:

1. A method of patterning a substrate, positioned on a motion stage, with a template having a mold, said method comprising:
    positioning conformable material between said substrate and said mold;
    filling a volume defined between said mold and said substrate with said conformable material through capillary action between said conformable material and one of said mold and said substrate; and
    applying a pulling force on at least one of said motion stage and said mold to compensate for tensile forces, associated with said capillary action, upon said mold.

2. The method as recited in claim 1 wherein positioning said conformable material further includes disposing said conformable material on said mold and placing said mold in superimposition with said substrate.

3. The method as recited in claim 1 wherein positioning said conformable material further includes disposing said conformable material on said substrate and placing said mold in superimposition with said substrate.

4. The method as recited in claim 1 wherein filling said volume further includes filling said volume by capillary action of said conformable material with both said mold and said substrate.

5. The method as recited in claim 1 wherein filling said volume further includes establishing a distance between said template and said conformable material to allow a sub-section of said template to contact said conformable material.

6. The method as recited in claim 1 wherein filling said volume further includes establishing a distance between said template and said conformable material to allow a sub-section of said template to contact said conformable material while minimizing variances in said distance to attenuate creation of compressive forces between said mold and said conformable material.

7. The method as recited in claim 1 wherein positioning said conformable material further includes depositing said conformable material on a sub-portion of a region with filling said volume further including wetting both said mold and areas of said region outside of said sub-portion with said conformable material.

8. The method as recited in claim 1 wherein positioning said conformable material further includes depositing said conformable material on a sub-portion of a region with filling said volume further including wetting both said mold and areas of said region outside of said sub-portion with said conformable material while restricting movement of said conformable material outside of said region by capillary action of said conformable material with said mold.

9. The method as recited in claim 1 wherein said template further includes first and second molds, with said first mold being disposed opposite to a first region of said substrate, and said second mold being disposed opposite to a second region of said substrate, with said conformable material disposed in a sub-area of said first region and a sub-part of said second region, with filling said volume further including restricting movement of said conformable material in said sub-area outside of said first region and restricting movement of said conformable material in said sub-part outside of said second region by capillary action of said conformable material with said mold.

10. The method as recited in claim 1 wherein said template further includes a plurality of spaced-apart molds, a first subset of which is disposed opposite to a first region of said substrate, with remaining molds of said plurality of spaced-apart molds being disposed opposite to a second region of said substrate, with said conformable material being disposed in said first region and absent from said second region.

11. The method as recited in claim 10 wherein said first subset consists of one mold.

12. A method of patterning a substrate, positioned on a motion stage, with a template having a mold, said method comprising:
    positioning conformable material between said substrate and said mold;
    establishing a distance between said mold and said substrate to facilitate filling a volume, defined between said mold and said substrate, with said conformable material through capillary action between said conformable material and said mold and said substrate to form a contiguous layer of said conformable material having first and second sub-portions, said first sub-portions having a first thickness and said second sub-portions having a second thickness differing from said first thickness, with said first and second thicknesses being greater than zero; and
    applying a pulling force on one of said motion stage and said mold to compensate for tensile forces, associated with said capillary action, upon said mold.

13. The method as recited in claim 12 wherein establishing said distance further includes minimizing variations in said distance to be within a predetermined range of variations.

14. The method as recited in claim 12 wherein establishing said distance further includes maintaining said distance to be within a predetermined range to attenuate creation of compressive forces between said mold and said conformable material.

15. The method as recited in claim 12 wherein positioning said conformable material further includes depositing said conformable material on a sub-portion of a region with filling said volume further including wetting both said mold and areas of said region outside of said sub-portion with said conformable material.

16. The method as recited in claim 12 wherein positioning said conformable material further includes depositing said conformable material on a sub-portion of a region with filling said volume further including wetting both said mold and areas of said region outside of said sub-portion with said conformable material while restricting movement of said conformable material outside of said region by capillary action of said conformable material with said mold.

17. The method as recited in claim 12 wherein said template further includes first and second molds, with said first mold being disposed opposite to a first region of said substrate, and said second mold being disposed opposite to a second region of said substrate, with said conformable material disposed in a sub-area of said first region and a sub-part of said second region, with filling said volume further including restricting movement of said conformable material in said sub-area outside of said first region and restricting movement of said conformable material in said sub-part outside of said second region by capillary action of said conformable material with said mold.

18. The method as recited in claim 12 wherein said template farther includes a plurality of spaced-apart molds, a first subset of which is disposed opposite to a first region of said substrate, with remaining molds of said plurality of spaced-apart molds being disposed opposite to a second region of said substrate, with said conformable material being disposed in said first region and absent from said second region.

19. A method of patterning a substrate, positioned on a motion stage, with a template, said method comprising:
    forming conformable material on said substrate;
    placing said template in superimposition with said conformable material, with said template including a mold facing said conformable material;
    moving a sub-portion of said conformable material, through capillary action between said conformable material and said mold and said substrate, in a direction away from said substrate to wet a region of said mold and conform to a shape thereof forming a contiguous layer of said conformable material having first and second sub-portions, said first sub-portions having a first thickness and said second sub-portions having a second thickness differing from said first thickness, with said first and second thicknesses being greater than zero;
    applying a pulling force on one of said motion stage and said mold to compensate for tensile forces, associated with said capillary action, upon said mold.

20. The method as recited in claim 19 wherein moving said sub-portion further includes filling a volume defined between said mold and said substrate by capillary action of said conformable material with both said mold and said substrate.

21. The method as recited in claim 20 wherein filling said volume further includes establishing a distance between said template and said conformable material to allow a sub-section of said template to contact said conformable material.

22. The method as recited in claim 21 wherein filling said volume further includes establishing a distance between said template and said conformable material to allow a sub-section of said template to contact said conformable material while minimizing variances in said distance to attenuate creation of compressive forces between said mold and said conformable material.

23. The method as recited in claim 22 wherein forming said conformable material further includes depositing said conformable material on a sub-portion of said region with filling said volume further including wetting both said mold and areas of said region outside of said sub-portion with said conformable material while restricting movement of said conformable material outside of said region by capillary action of said conformable material with said mold.

24. The method as recited in claim 23 wherein said template further includes first and second molds, with said first mold being disposed opposite to a first region of said substrate, and said second mold being disposed opposite to a second region of said substrate, with said conformable material disposed in a sub-area of said first region and a sub-part of said second region, with filling said volume further including restricting movement of said conformable material in said sub-area outside of first region and restricting movement of said conformable material in said sub-part outside of said second region by capillary action of said conformable material with said mold.

25. The method as recited in claim 23 wherein said template further includes a plurality of spaced-apart molds, a first subset of which is disposed opposite to a first region of said substrate, with remaining molds of said plurality of spaced-part molds being disposed opposite to a second region of said substrate, with said conformable material being disposed in said first region and absent from said second region.

26. The method as recited in claim 25 wherein said first subset consists of one mold.

27. The method as recited in claim 1 further including solidifying said conformable material.

28. The method as recited in claim 27 wherein solidifying said conformable material further includes exposing said conformable material to actinic radiation.

29. The method as recited in claim 28 wherein said actinic radiation consists of ultraviolet radiation.

30. The method as recited in claim 1 wherein applying said force further includes maximizing a thickness uniformity of said conformable material.

31. The method as recited in claim 12 wherein applying said force further includes maximizing a thickness uniformity of said conformable material.

32. The method as recited in claim 12 further including solidifying said conformable material.

33. The method as recited in claim 32 wherein solidifying said conformable material further includes exposing said conformable material to actinic radiation.

34. The method as recited in claim 19 further including solidifying said conformable material.

35. The method as recited in claim 34 wherein solidifying further includes exposing said conformable material to actinic radiation.

36. The method as recited in claim 27 further including applying said pulling force prior to solidifying said conformable material.

37. The method as recited in claim 1 wherein positioning further includes positioning a plurality of droplets of said conformable material on said substrate.

38. The method as recited in claim 37 further including contacting said plurality of droplets of said conformable material with said mold.

39. The method as recited in claim 32 further including applying said pulling force prior to solidifying said conformable material.

40. The method as recited in claim 12 wherein positioning further includes positioning a plurality of droplets of said conformable material on said substrate.

41. The method as recited in claim 40 further including contacting said plurality of droplets of said conformable material with said mold.

42. The method as recited in claim 34 further including applying said pulling force prior to solidifying said conformable material.

43. The method as recited in claim 19 wherein positioning further includes positioning a plurality of droplets of said conformable material on said substrate.

44. The method as recited in claim 43 further including contacting said plurality of droplets of said conformable material with said mold.

45. A method of patterning a substrate, positioned on a motion stage, with a template having a mold, said method comprising:
positioning conformable material between said substrate and said mold;
filling a volume defined between said mold and said substrate with said conformable material through capillary action between said conformable material and said mold and said substrate; and
applying a pulling force on at least one of said motion stage and said mold to compensate for tensile forces, associated with said capillary action, upon said mold.

46. The method as recited in claim 45 wherein positioning said conformable material further includes disposing said conformable material on said mold and placing said mold in superimposition with said substrate.

47. The method as recited in claim 45 wherein positioning said conformable material further includes disposing said conformable material on said substrate and placing said mold in superimposition with said substrate.

48. The method as recited in claim 45 wherein filling said volume further includes filling said volume by capillary action of said conformable material with both said mold and said substrate.

49. The method as recited in claim 45 wherein filling said volume further includes establishing a distance between said template and said conformable material to allow a sub-section of said template to contact said conformable material.

50. The method as recited in claim 45 wherein filling said volume further includes establishing a distance between said template and said conformable material to allow a sub-section of said template to contact said conformable material while minimizing variances in said distance to attenuate creation of compressive forces between said mold and said conformable material.

51. The method as recited in claim 45 wherein positioning said conformable material further includes depositing said conformable material on a sub-portion of a region with filling said volume further including wetting both said mold and areas of said region outside of said sub-portion with said conformable material.

52. The method as recited in claim 45 wherein positioning said conformable material further includes depositing said conformable material on a sub-portion of a region with filling said volume further including wetting both said mold and areas of said region outside of said sub-portion with said conformable material while restricting movement of said conformable material outside of said region by capillary action of said conformable material with said mold.

53. The method as recited in claim 45 wherein said template further includes first and second molds, with said first mold being disposed opposite to a first region of said substrate, and said second mold being disposed opposite to a second region of said substrate, with said conformable material disposed in a sub-area of said first region and a sub-part of said second region, with filling said volume further including restricting movement of said conformable material in said sub-area outside of said first region and restricting movement of said conformable material in said sub-part outside of said second region by capillary action of said conformable material with said mold.

54. The method as recited in claim 45 further including solidifying said conformable material.

55. The method as recited in claim 54 wherein solidifying said conformable material further includes exposing said conformable material to actinic radiation.

56. The method as recited in claim 55 wherein said actinic radiation consists of ultraviolet radiation.

57. The method as recited in claim 45 wherein said template further includes a plurality of spaced-apart molds, a first subset of which is disposed opposite to a first region of said substrate, with remaining molds of said plurality of spaced-apart molds being disposed opposite to a second region of said substrate, with said conformable material being disposed in said first region and absent from said second region.

58. The method as recited in claim 57 wherein said first subset consists of one mold.

59. The method as recited in claim 45 wherein applying said force further includes maximizing a thickness uniformity of said conformable material.

60. The method as recited in claim 54 further including applying said pulling force prior to solidifying said conformable material.

61. The method as recited in claim 45 wherein positioning further includes positioning a plurality of droplets of said conformable material on said substrate.

62. The method as recited in claim 61 further including contacting said plurality of droplets of said conformable material with said mold.

* * * * *